United States Patent
Stamper et al.

(10) Patent No.: US 9,673,220 B1
(45) Date of Patent: Jun. 6, 2017

(54) CHIP STRUCTURES WITH DISTRIBUTED WIRING

(71) Applicant: GLOBALFOUNDRIES INC., Grand Cayman (KY)

(72) Inventors: Anthony K. Stamper, Essex Junction, VT (US); Randy L. Wolf, Essex Junction, VT (US); Mark D. Jaffe, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/065,331

(22) Filed: Mar. 9, 2016

(51) Int. Cl.
| | |
|---|---|
| *H01L 27/12* | (2006.01) |
| *H01L 29/06* | (2006.01) |
| *H01L 23/528* | (2006.01) |
| *H01L 23/522* | (2006.01) |
| *H01L 29/423* | (2006.01) |
| *H01L 29/417* | (2006.01) |
| *H01L 29/08* | (2006.01) |
| *H01L 21/84* | (2006.01) |
| *H01L 21/8234* | (2006.01) |
| *H01L 21/683* | (2006.01) |
| *H01L 21/768* | (2006.01) |

(52) U.S. Cl.
CPC ...... *H01L 27/1203* (2013.01); *H01L 21/6835* (2013.01); *H01L 21/76802* (2013.01); *H01L 21/76877* (2013.01); *H01L 21/823475* (2013.01); *H01L 21/84* (2013.01); *H01L 23/528* (2013.01); *H01L 23/5226* (2013.01); *H01L 29/0649* (2013.01); *H01L 29/0847* (2013.01); *H01L 29/4175* (2013.01); *H01L 29/4238* (2013.01)

(58) Field of Classification Search
CPC ............. H01L 27/1203; H01L 21/6835; H01L 21/76802; H01L 21/76877; H01L 21/823475; H01L 21/84
See application file for complete search history.

(56) References Cited

U.S. PATENT DOCUMENTS

| | | |
|---|---|---|
| 5,272,095 A | 12/1993 | Enquist et al. |
| 5,318,916 A | 6/1994 | Enquist et al. |
| 6,242,794 B1 | 6/2001 | Enquist |
| 6,368,930 B1 | 4/2002 | Enquist |
| 6,500,694 B1 | 12/2002 | Enquist |
| 6,563,133 B1 | 5/2003 | Tong |
| 6,627,531 B2 | 9/2003 | Enquist |
| 6,740,909 B2 | 5/2004 | Enquist |
| 6,756,281 B2 | 6/2004 | Enquist |
| 6,822,326 B2 | 11/2004 | Enquist et al. |
| 6,864,585 B2 | 3/2005 | Enquist |
| 6,867,073 B1 | 3/2005 | Enquist |

(Continued)

*Primary Examiner* — Errol Fernandes
(74) *Attorney, Agent, or Firm* — Thompson Hine LLP; Anthony Canale

(57) ABSTRACT

Chip structures that include distributed wiring layouts and fabrication methods for forming such chip structures. A device structure is formed that includes a plurality of first device regions and a plurality of second device regions. A first wiring level is formed that includes a first wire coupled with the first device regions. A second wiring level is formed that includes a second wire coupled with the second device regions. The first wiring level is vertically separated from the second wiring level by a buried oxide layer of the silicon-on-insulator substrate.

14 Claims, 4 Drawing Sheets

(56) References Cited

U.S. PATENT DOCUMENTS

| | | |
|---|---|---|
| 6,902,987 B1 | 6/2005 | Tong et al. |
| 6,905,557 B2 | 6/2005 | Enquist |
| 6,962,835 B2 | 11/2005 | Tong et al. |
| 6,984,571 B1 | 1/2006 | Enquist |
| 7,037,755 B2 | 5/2006 | Enquist |
| 7,041,178 B2 | 5/2006 | Tong et al. |
| 7,109,092 B2 | 9/2006 | Tong |
| 7,126,212 B2 | 10/2006 | Enquist et al. |
| 7,332,410 B2 | 2/2008 | Tong |
| 7,335,572 B2 | 2/2008 | Tong et al. |
| 7,335,996 B2 | 2/2008 | Tong |
| 7,341,938 B2 | 3/2008 | Enquist |
| 7,387,944 B2 | 6/2008 | Tong et al. |
| 7,462,552 B2 | 12/2008 | Tong et al. |
| 7,485,968 B2 | 2/2009 | Enquist et al. |
| 7,553,744 B2 | 6/2009 | Tong et al. |
| 7,602,070 B2 | 10/2009 | Tong et al. |
| 7,622,324 B2 | 11/2009 | Enquist et al. |
| 7,714,446 B2 | 5/2010 | Enquist |
| 7,807,549 B2 | 10/2010 | Tong et al. |
| 7,842,540 B2 | 11/2010 | Tong et al. |
| 7,862,885 B2 | 1/2011 | Tong |
| 7,871,898 B2 | 1/2011 | Tong et al. |
| 7,956,447 B2 | 6/2011 | Enquist et al. |
| 8,053,329 B2 | 11/2011 | Tong et al. |
| 8,153,505 B2 | 4/2012 | Tong et al. |
| 8,163,373 B2 | 4/2012 | Tong |
| 8,389,378 B2 | 3/2013 | Enquist et al. |
| 8,524,533 B2 | 9/2013 | Tong et al. |
| 8,709,938 B2 | 4/2014 | Enquist et al. |
| 8,735,219 B2 | 5/2014 | Enquist et al. |
| 8,841,002 B2 | 9/2014 | Tong |
| 8,846,450 B2 | 9/2014 | Tong et al. |
| 2014/0346601 A1* | 11/2014 | Sugiura .............. H01L 29/78 257/347 |
| 2015/0091066 A1* | 4/2015 | Lee .............. H01L 21/76898 257/255 |

* cited by examiner

US 9,673,220 B1

CHIP STRUCTURES WITH DISTRIBUTED WIRING

BACKGROUND

The invention relates generally to semiconductor devices and integrated circuit fabrication and, in particular, to chip structures that include distributed wiring layouts and fabrication methods for forming such chip structures.

Complementary metal-oxide semiconductor (CMOS) circuitry is utilized in mobile communication devices (e.g., laptops, cellular phones, tablets, etc.) to handle wireless high frequency signals transmitted to and/or received by the mobile communication devices. The circuitry may include a high frequency switch that allows for high frequency signals received by an antenna to be routed from a low noise amplifier to other chip circuitry and for high frequency signals to be routed from a power amplifier to the antenna. The high frequency switch may include a stack or bank of field effect transistors formed by CMOS processes.

A back-end-of-line (BEOL) interconnect structure may be used to route signals to and from the active devices of an integrated circuit, such as a switch of a CMOS integrated circuit. The BEOL interconnect structure may include wiring embedded in a stack of dielectric layers to create a stack of wiring levels defining an interconnection network for the signals and power. The BEOL interconnect structure may be fabricated using damascene processes in which the different wiring levels in the stack are individually formed.

Chip structures with improved wiring layouts and fabrication methods for forming such chip structures are needed.

SUMMARY

In embodiments of the invention, chip structures formed using a silicon-on-insulator substrate and methods for forming chip structures are provided. A device structure is formed that includes a plurality of first device regions and a plurality of second device regions. A first wiring level is formed that includes a first wire coupled with the first device regions. A second wiring level is formed that includes a second wire coupled with the second device regions. The first wiring level is vertically separated from the second wiring level by a buried oxide layer of the silicon-on-insulator substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
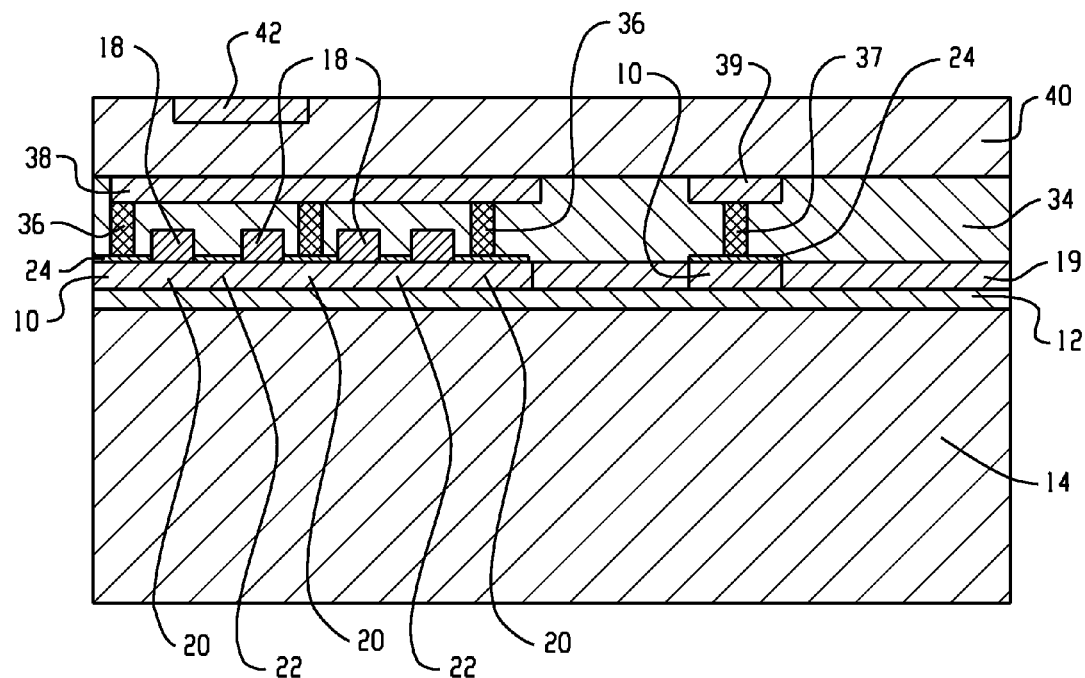
FIGS. 1-3 are cross-sectional views of a portion of a substrate at successive fabrication stage of a processing method for fabricating a device structure in accordance with an embodiment of the invention.
Figure 1A:
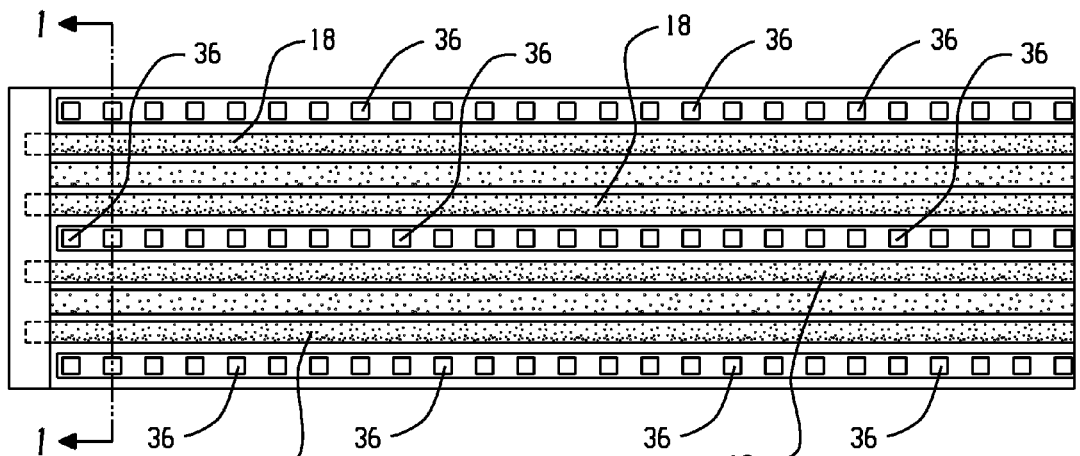
FIG. 1A is a top view of the substrate portion of FIG. 1.

With reference to FIGS. 1, 1A and in accordance with an embodiment of the invention, a silicon-on-insulator (SOI) substrate may include a handle wafer 14, a buried oxide (BOX) layer 12, and a device layer 10 formed from a thin silicon layer on the BOX layer 12. The device layer 10 is separated from the handle wafer 14 by the intervening BOX layer 12, and is electrically isolated from the handle wafer 14 by the BOX layer 12.

Front-end-of-line (FEOL) processing is used to fabricate complementary metal-oxide semiconductor (CMOS) field effect transistors using the device layer 10 on the front side of the SOI substrate. The CMOS field effect transistors may be arranged to form RF switches with gate fingers 18 that are located between alternating source regions 20 and drain regions 22. The source regions 20 are serially arranged in a row aligned in a direction parallel to the long axis of the gate fingers 18. The drain regions 22 are also serially arranged in a row aligned in a direction parallel to the long axis of the gate fingers 18. Any given row of source regions 20 is separated from the adjacent row of drain regions 22 by a channel region beneath a corresponding one of the gate fingers 18. Shallow trench isolation (STI) oxide 19 or any other type of structure and method (e.g., local oxidization of silicon (LOCOS)), is used to electrically isolate the SOI thin silicon regions of the device layer 10 from adjacent SOI thin silicon regions.

In addition to CMOS technologies, the methods and structures as described herein may be applied to any type of integrated circuit IC, including but not limited to BICMOS, BIPOLAR, etc. Other type of active and passive device structures, such as bipolar junction transistors, capacitors, resistors, etc., may be fabricated using the device layer 10 during the FEOL processing.

The gate fingers 18 of the field effect transistors may be formed by depositing one or more layers (e.g., polysilicon) and patterning these layers with photolithography and etching to provide parallel fingers. Each gate finger 18 includes a gate electrode composed of a conductor, such as a metal or doped polysilicon with a metal silicide, or a layered combination of these and other conductive materials, and a gate dielectric composed of a dielectric or insulating material including, such as silicon dioxide ($SiO_2$), a high-k dielectric such as hafnium oxide ($HfO_2$), or a layered combination of these and other dielectric materials. The field effect transistors may comprise NFET devices in which the source regions 20 and drain regions 22 are doped with a Group V dopant (e.g., arsenic (As) or phosphorous (P)) to provide n-type conductivity. If the field effect transistors source are PFET devices, then the source regions 20 and the drain regions 22 are doped with a Group III dopant (e.g., boron (B)) to provide p-type conductivity.

Prior to middle-of-line processing (MOL), a silicide layer 24 may be formed on the surfaces of the thin silicon regions of the device layer 10, such as the source regions 20, the drain regions 22, and other thin silicon regions of device layer 10 coupled with contacts, such as regions of device layer 10 coupled with source contacts 36 and pass-through contact 37, to reduce the resistance, and a wiring level is formed that includes, one or more dielectric layers 34, the source contacts 36 that couple a wire 38 with the source regions 20 of the device layer 10, and the pass-through contacts 37 for coupling a wire 39 with other thin silicon regions of the device layer 10. The source contacts 36 may be holes or bars, as known in the art. The wiring level 32 does not include any contacts coupled with the drain regions 22. Pass-through contact 37 will connect to the wiring under the BOX layer 12 that will eventually be used to contact the source regions 20. The interconnect structure may optionally include one or more additional wiring levels 40 fabricated during back-end-of-line (BEOL) processing and which may include a bond pad 42 used to contact a package. The source regions 20 and drain regions 22 may be fully-silicided, i.e., silicided across the full thickness of these thin silicon regions of device layer 10, again to lower their resistance. One or more of the BEOL wiring levels includes the wire 39 that is coupled with the pass-through contact 37.

Figure 2:
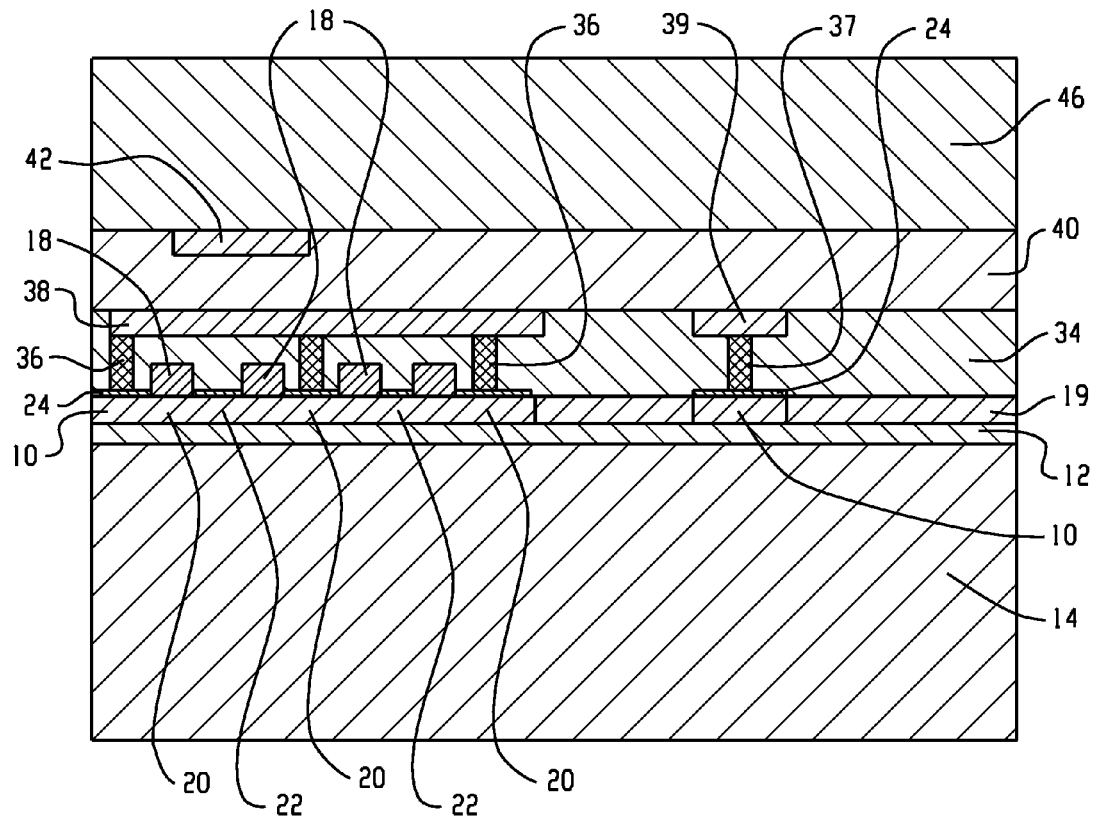

With reference to FIG. 2 in which like reference numerals refer to like features in FIG. 1 and at a subsequent fabrication stage of the processing method, a temporary handle substrate 46 is attached to the front side surface of the SOI substrate to create an assembly. Confronting surfaces of the SOI substrate and the temporary handle substrate 46 may be bonded together, for example, with a reflowable adhesive (e.g., HD3007 polyimide), an oxide to oxide bond, an eutectic metal to metal bond, or any other temporary bond method known in the art. The temporary handle substrate 46 may be comprised of silicon, silica glass, alumina, sapphire, etc. as known in the art.

Figure 3:
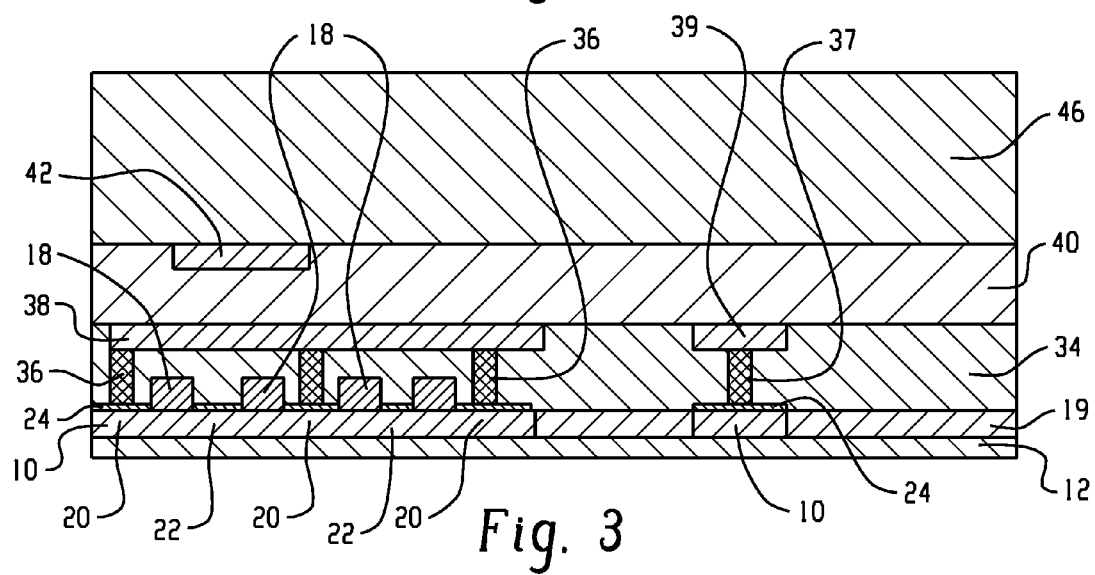

With reference to FIG. 3 in which like reference numerals refer to like features in FIG. 2 and at a subsequent fabrication stage of the processing method, the handle wafer 14 is removed from its backside to expose the BOX layer 12. The handle wafer 14 may be removed by, for example, grinding followed by a hydrofluoric acid vapor or a wet clean to remove oxide from the silicon surface and then a silicon wet etch using a solution of potassium hydroxide or sodium hydroxide, as known in the art.

Figure 4:
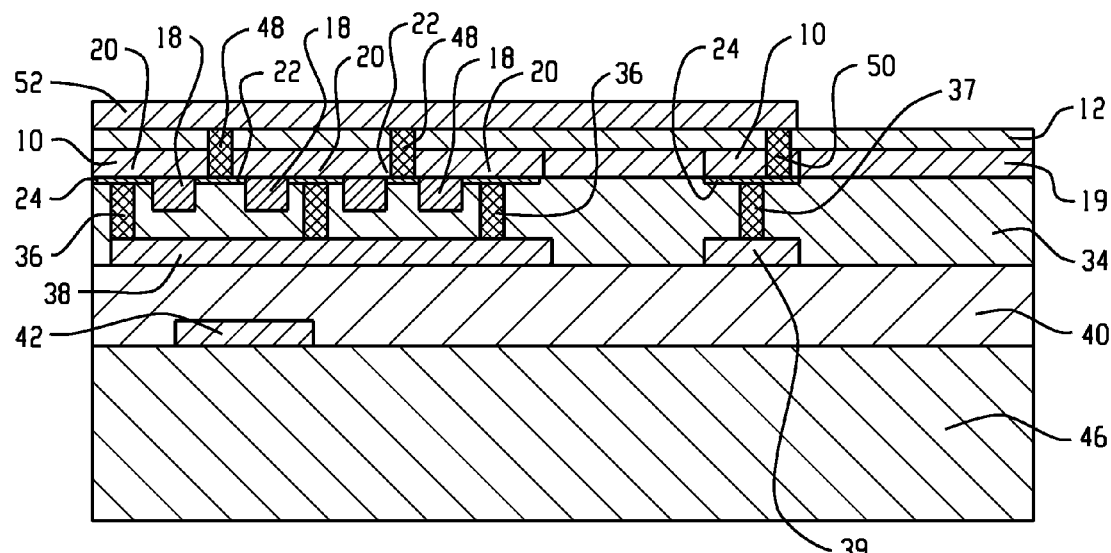
FIGS. 4-5 are cross-sectional views at fabrication stages subsequent to FIG. 3 in which the substrate is inverted and the cross-section is taken through one of the drain regions of the switch instead of one of the source regions as in FIG. 3.

With reference to FIG. 4 in which like reference numerals refer to like features in FIG. 3 and at a subsequent fabrication stage of the processing method, the substrate is inverted and drain contacts 48 to the drain regions 22, a pass-through contact 50 to a silicided thin silicon to pass through the drain contacts 48 to the front side of the device layer 10, and a wire 52 are formed on the exposed surface of the BOX layer 12. The drain contacts 48 and pass-through contact 50 extend through the BOX layer 12 and the device layer 10 to the drain regions 22, and couple the wire 52 with the drain regions 22 and the pass-through contact 50 with the pass-through contact 37. The drain contacts 48 and the pass-through contact 50 may be formed in respective vias that are etched through the BOX layer 12 and the device layer 10 to reach the drain regions 22. The drain contacts 48 may extend through the respective full thicknesses of the device layer 10 and the BOX layer 12 to reach the silicide layer 24 associated with the drain regions 22 or may be partially etched into the device layer 10. The drain regions 22 may be fully silicided vertically through device layer 10 down to the BOX layer 12 such that the drain contacts 48 extend to the silicide layer 24. A pass-through via 50, the silicided portion of the device layer 10, and the pass-through contact 37 provide a conductive path connecting the backside wire 52 with the wire 39 on the front side of the SOI substrate.

Figure 5:
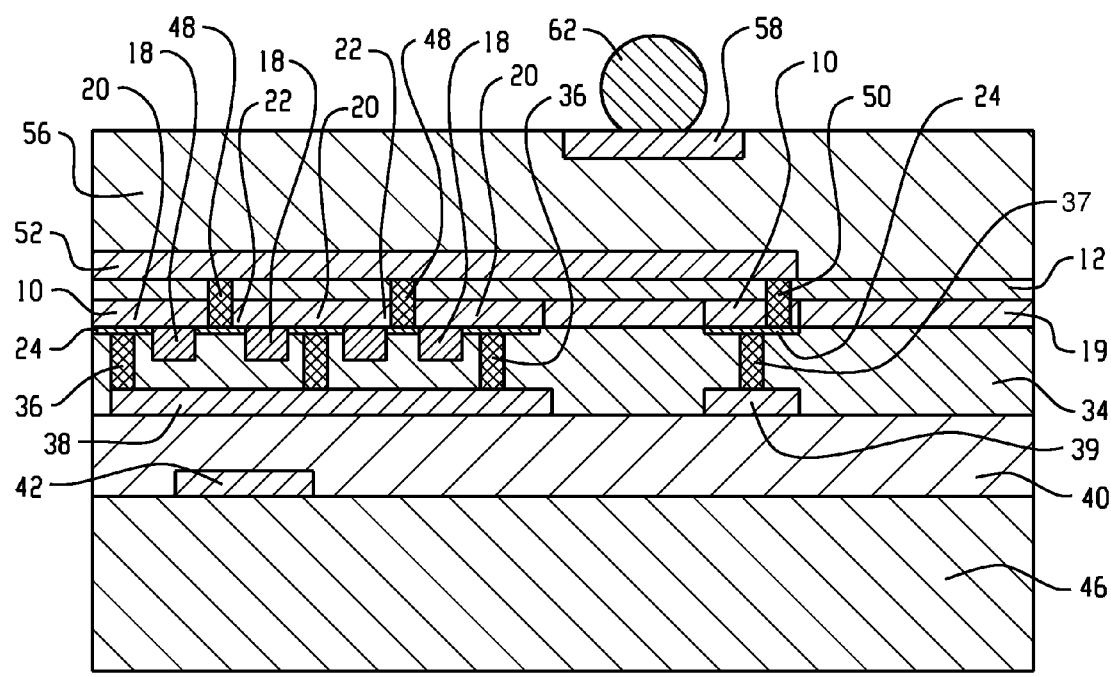

With reference to FIG. 5 in which like reference numerals refer to like features in FIG. 4 and at a subsequent fabrication stage of the processing method, back side packaging may be used. To that end, one or more wiring levels may be formed on the back side of the SOI substrate. The back side of the SOI substrate is separated from the front side of the SOI substrate by at least the BOX layer 12. A representative wiring level may include one or more dielectric layers 56, a pad 58 in the one or more dielectric layers 56, and a packaging connection 62 that is formed on, or placed onto, the pad 58. The packaging connection 62 may be a bump that is configured to be reflowed to attach the chip to another substrate, a copper pillar-type connection, or a wire bond. In an embodiment, the additional wiring levels may be omitted.

In accordance with embodiments of the invention, the wiring in the wiring level coupled with the source regions 20 and the wiring in the wiring level coupled with the drain regions 22 are redistributed relative to conventional layouts in which all wiring levels of the interconnect structure are located on the substrate front side (i.e., the side of the substrate that includes the device layer 10). In the wiring layout, the wiring level including the wiring coupled with the source regions 20 is located on the front side of the SOI substrate and the wiring level including the wiring coupled with the drain regions 22 is located on the back side of the SOI substrate such that these portions of the interconnect wiring are located on opposites sides of (e.g., above and below) the BOX layer 12 and respectively located on opposites sides of (e.g., above and below) the gate fingers 18, the source regions 20, and the drain regions 22. According to embodiments of the invention, the redistribution of the wiring operates to reduce the wiring density, in this instance associated with the field effect transistors of the switch, which reduces the contribution from the wiring capacitance to the total parasitic capacitance of the switch. As a result, device performance may be improved.

In an alternative embodiment, the wiring level including the wiring coupled with the source regions 20 may be located on the back side of the SOI substrate and the wiring level including the wiring coupled with the drain regions 22 may be located on the front side of the SOI substrate.

Figure 6:
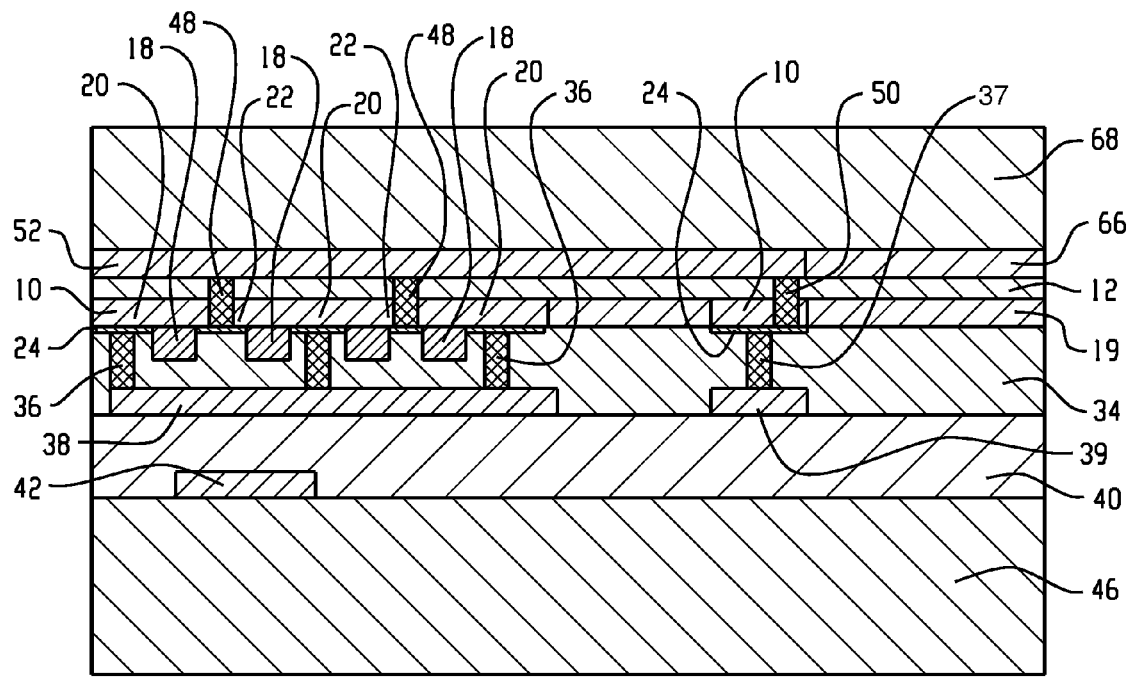
FIGS. 6-7 are a cross-sectional views at successive fabrication stages subsequent to FIG. 3 in accordance with an alternative embodiment of the invention.

With reference to FIG. 6 in which like reference numerals refer to like features in FIG. 4 and at a fabrication stage subsequent to FIG. 4 of a processing method in accordance with an alternative embodiment, a substrate 68 is attached to the BOX layer 12 at the back side of the substrate to create an assembly. Confronting surfaces of the BOX layer 12 and the substrate 68 may be bonded together, for example, with a reflowable adhesive (e.g., HD3007 polyimide) or other wafer bonding method as discussed above. The substrate 68 may be comprised of silicon, silica glass, etc. as known in the art. An optional dielectric layer 66 may be applied and planarized prior to attaching the substrate 68.

Figure 7:
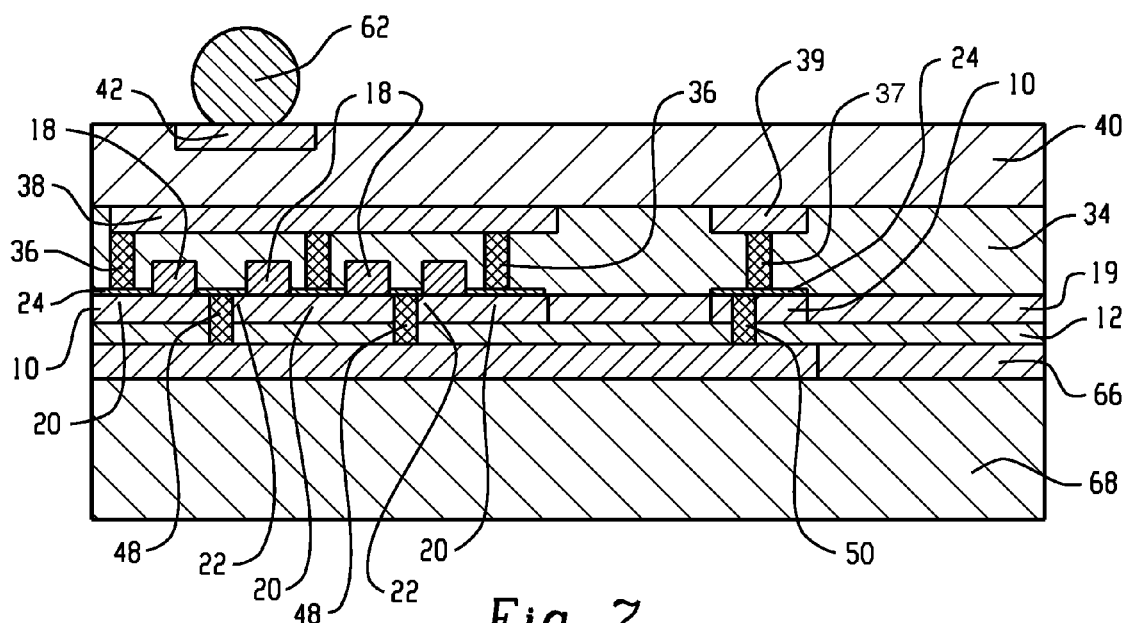

With reference to FIG. 7 in which like reference numerals refer to like features in FIG. 6 and at a fabrication stage subsequent, substrate 46 is removed from the assembly and without disturbing the bond between the substrate 68 and the dielectric layer 66. The packaging connection 62 is formed on, or placed onto, the bond pad 42.

In the representative embodiment, a multi-finger field effect transistor is formed on a SOI substrate with source wires and contacts formed below the source and with drain wires and contacts formed above the drain. However, the embodiments of the invention are applicable to any multi-finger device to improve AC characteristics, such as reducing wire and contact capacitance. In such an alternative embodiment, a vertical or horizontal multi-finger NPN transistor, either homo-junction or hetero-junction, may include, for example, emitter contacts extending from above the device (e.g., from one side of the BOX layer) to the emitter fingers and collector contacts extending from below the device (e.g., from an opposite side of the BOX layer) to the collector sections. In another such alternative embodiment, a laterally diffused metal oxide semiconductor (LDMOS) device may include gate contacts extending from above the device and source/drain contacts extending from below the device.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane. Terms such as "above" and "below" are used to indicate positioning of elements or structures relative to each other rather than relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A chip structure formed using a silicon-on-insulator substrate, the chip structure comprising:
   a device structure including a plurality of gate fingers, a plurality of source regions, and a plurality of drain regions;
   a first wiring level including a first wire coupled with the source regions; and
   a second wiring level including a second wire and a plurality of contacts extending from the wire through a buried oxide layer of the silicon-on-insulator substrate to the drain regions,
   wherein the first wiring level is vertically separated from the second wiring level by the buried oxide layer of the silicon-on-insulator substrate, the source regions and the drain regions are formed in a device layer of the silicon-on-insulator substrate, each of the drain regions includes a silicide layer, and each of the contacts is directly coupled with the silicide layer of one of the drain regions.

2. The chip structure of claim 1 wherein the device layer of the silicon-on-insulator substrate is located between the first wiring level and the second wiring level.

3. The chip structure of claim 1 further comprising:
   a pass-through contact extending through the silicon-on-insulator substrate between the first wiring level and the second wiring level.

4. The chip structure of claim 1 further comprising:
   a substrate attached to the first wiring level.

5. The chip structure of claim 1 further comprising:
   a substrate attached to the second wiring level.

6. The chip structure of claim 1 wherein the gate fingers are vertically located between the first wiring level and the second wiring level.

7. The chip structure of claim 6 wherein the device layer is located between the first wiring level and the second wiring level, and the gate fingers are separated from the second wiring level by the device layer.

8. The chip structure of claim 1 wherein the device structure is a field effect transistor, and each source region is separated from one of the drain regions by one of the gate fingers.

9. The chip structure of claim 8 wherein the gate fingers are vertically located between the first wiring level and the second wiring level.

10. A method for forming a chip structure using a silicon-on-insulator substrate, the method comprising:
    forming a device structure including a plurality of gate fingers, a plurality of source regions, and a plurality of drain regions;
    forming a first wiring level including a first wire coupled with the source regions; and
    forming a second wiring level including a second wire and a plurality of contacts extending from the wire through a buried oxide layer of the silicon-on-insulator substrate to the drain regions,
    wherein the first wiring level is vertically separated from the second wiring level by the buried oxide layer of the silicon-on-insulator substrate, the source regions and the drain regions are formed in a device layer of the silicon-on-insulator substrate, each of the drain regions includes a silicide layer, and each of the contacts is directly coupled with the silicide layer of one of the drain regions.

11. The method of claim 10 further comprising:
    before the second wiring level is formed, removing a handle wafer of the silicon-on-insulator substrate to expose the buried oxide layer; and
    forming the second wire on the buried oxide layer.

12. The method of claim 10 further comprising:
    after the second wiring level is formed, attaching a substrate to the second wiring level.

13. The method of claim 10 further comprising:
    after the second wiring level is formed, attaching a substrate to the first wiring level.

14. The method of claim 10 wherein the device structure is a field effect transistor, each source region is separated from one of the drain regions by one of the gate fingers, and the gate fingers are vertically located between the first wiring level and the second wiring level.

* * * * *